United States Patent
Yanaura

(10) Patent No.: US 10,892,203 B2
(45) Date of Patent: Jan. 12, 2021

(54) POWER SEMICONDUCTOR MODULE

(71) Applicant: MITSUBISHI ELECTRIC CORPORATION, Chiyoda-ku (JP)

(72) Inventor: Satoshi Yanaura, Chiyoda-ku (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/483,970

(22) PCT Filed: Nov. 15, 2017

(86) PCT No.: PCT/JP2017/041164
§ 371 (c)(1),
(2) Date: Aug. 6, 2019

(87) PCT Pub. No.: WO2018/179573
PCT Pub. Date: Oct. 4, 2018

(65) Prior Publication Data
US 2020/0091024 A1 Mar. 19, 2020

(30) Foreign Application Priority Data
Mar. 29, 2017 (JP) .................................. 2017-064797

(51) Int. Cl.
*H01L 23/29* (2006.01)
*H01L 23/053* (2006.01)
(Continued)

(52) U.S. Cl.
CPC .......... *H01L 23/296* (2013.01); *H01L 23/053* (2013.01); *H01L 25/18* (2013.01); *H01L 29/0619* (2013.01); *H01L 23/49* (2013.01)

(58) Field of Classification Search
CPC ..... H01L 23/296; H01L 23/053; H01L 25/18; H01L 29/0619; H01L 23/49;
(Continued)

(56) References Cited

U.S. PATENT DOCUMENTS

2007/0284719 A1 12/2007 Shiota et al.
2011/0287316 A1* 11/2011 Lu .......................... H01G 11/46
429/215
(Continued)

FOREIGN PATENT DOCUMENTS

| JP | 10-270609 A | 10/1998 |
| JP | 2007-305757 A | 11/2007 |
| JP | 2017-28132 A | 2/2017 |

OTHER PUBLICATIONS

International Search Report dated Jan. 30, 2018 in PCT/JP2017/041164 filed Nov. 15, 2017.

*Primary Examiner* — Shahed Ahmed
(74) *Attorney, Agent, or Firm* — Xsensus LLP

(57) ABSTRACT

Provided is a power semiconductor module including: a metal base plate; an insulating substrate arranged on the metal base plate and provided with an electrode; a semiconductor element arranged on the insulating substrate; a case arranged on the metal base plate so as to surround the insulating substrate and the semiconductor element; and a potting material filled into a space defined by the metal base plate and the case so as to encapsulate the insulating substrate and the semiconductor element. The potting material includes: a silicone gel; and a conductivity-imparting agent that is added to the gel and contains a silicon atom and an ionic group.

3 Claims, 7 Drawing Sheets

(51) Int. Cl.
*H01L 25/18* (2006.01)
*H01L 29/06* (2006.01)
*H01L 23/49* (2006.01)

(58) Field of Classification Search
CPC . H01L 23/28–3192; H01L 23/562–576; H01L 2924/181–186; H01L 29/0696; H01L 2224/83455; H01L 24/05; H01L 2224/04026
See application file for complete search history.

(56) References Cited

U.S. PATENT DOCUMENTS

| | | | | |
|---|---|---|---|---|
| 2013/0062750 | A1* | 3/2013 | Lenniger | H01L 24/40 257/691 |
| 2013/0134572 | A1* | 5/2013 | Lenniger | H01L 23/3677 257/690 |
| 2013/0172192 | A1* | 7/2013 | Saxena | C08G 77/30 504/360 |
| 2017/0025344 | A1 | 1/2017 | Kanai | |
| 2018/0366449 | A1* | 12/2018 | Ikenouchi | H01L 23/49833 |

* cited by examiner

FIG. 13

| ADDITION AMOUNT OF CONDUCTIVITY-IMPARTING AGENT (wt%) | LEAKAGE CURRENT (A) CAUSED BY APPLYING 1 KV TO COMB ELECTRODE | ELEMENT LEAKAGE CURRENT (mA) | PARTIAL DISCHARGE | INSULATION TEST |
|---|---|---|---|---|
| 0.1 | $1.2 \times 10^{-7}$ | PASSED | OUT OF MEASUREMENT | FAILED |
| 0.05 | $8.8 \times 10^{-7}$ | PASSED | OUT OF MEASUREMENT | FAILED |
| 0.005 | $1.5 \times 10^{-8}$ | PASSED | PASSED | PASSED |
| 0.001 | $8.1 \times 10^{-9}$ | PASSED | PASSED | PASSED |
| 0.0005 | $4.0 \times 10^{-9}$ | PASSED | PASSED | PASSED |
| 0.0001 | $2.3 \times 10^{-9}$ | PASSED | PASSED | PASSED |
| 0.00005 | $1.0 \times 10^{-9}$ | PASSED | PASSED | PASSED |
| 0.00001 | $4.2 \times 10^{-10}$ | PASSED | PASSED | PASSED |
| 0.000001 | $2.7 \times 10^{-11}$ | FAILED | PASSED | PASSED |

POWER SEMICONDUCTOR MODULE

TECHNICAL FIELD

The present invention relates to a power semiconductor module, in which a semiconductor element is arranged in a case, and is encapsulated with a potting/encapsulating material (hereinafter referred to as "potting material").

BACKGROUND ART

There are two types of power semiconductor modules, one of which is encapsulated by transfer molding and another of which is encapsulated (or encased) by potting. The transfer molding is often used for small-sized power semiconductor modules. The potting is often used for middle-sized or large-sized power semiconductor modules.

A related-art power semiconductor module encapsulated by potting includes: a case formed of a metal base plate and a frame-like case walls surrounding the metal base plate; a ceramic substrate that includes electrodes and is arranged in the case while being fixed onto the metal base plate; semiconductor elements fixed onto the ceramic substrate; wires, which are used to electrically connect between the semiconductor elements and the electrodes of the ceramic substrate; a silicone gel as a potting material, which is filled into the case, to thereby encapsulate individual components in the case; and a cover configured to cover an upper opening of the case.

In recent years, the power semiconductor modules have been required to have a high withstand voltage. At present, for example, trains employ module products that can withstand a voltage of 6.5 kV. As a method of reducing an amount of leakage current in the element for increasing a withstand voltage, in general, the following method is employed. That is, a guard ring is provided around the semiconductor elements to relax an electric field generated in this portion as well as suppress charge accumulation on the surface of the semiconductor elements. Further, downsizing of the semiconductor element has been also examined for saving costs. As a measure for the downsizing of the semiconductor element, the can be conceived to reduce the size of the guard ring around the semiconductor element. In this case, however, there is a risk of increasing the leakage current inside the semiconductor element. In addition, under a high-voltage condition, charges are continuously emitted from a wire and then accumulated in a region where the guard ring is formed, which leads to a problem in that an electric field cannot be relaxed enough.

As one approach for overcoming the circumstances above, an insulating, charging material having lower chargeability than that of an encapsulant, is arranged around the wires so as to prevent charges from moving from the wire into the encapsulant, to thereby reduce a leakage current generated inside the semiconductor element (see Patent Literature 1, for example).

As another approach thereto, a potting material is provided in two layers. In this case, semiconductive particles are dispersed in a lower layer (on a device or substrate side) thereof so as to ensure a nonlinear insulation resistance. With this structure, a portion that suffers from a high electric field can be allowed to relax the electric field (see Patent Literature 2, for example).

As still another approach thereto, an ion gel added with anionic liquid is applied to an intersection between a main surface of an insulating substrate and a side surface of a conductive plate arranged on the main surface of the insulating substrate. After that, an entire of the semiconductor elements are coated with a gel added with no ionic liquid, to thereby relax an electric field and suppress discharge at a creepage of the insulating substrate (see Patent Literature 3, for example).

CITATION LIST

Patent Literature

[PTL 1] JP 2007-305757 A
[PTL 2] JP 10-270609 A
[PTL 3] JP 2017-28132 A

SUMMARY OF INVENTION

Technical Problem

In the method as described in Patent Literature 1, the material of a low chargeability is arranged around each wire. However, a large number of wires are densely arranged, and a complicated operation is therefore required for arranging the material of a low chargeability around each wire. Hence, this method is not practical.

The method described in Patent Literature 2 has a problem of high costs due to the two-layer structure of the potting material. Further, since the potting material having semiconductive particles dispersed therein has a nonlinear insulation resistance, only a concentrated electric field can be relaxed. In addition, when the electric field exceeds a certain level, the insulation resistance is rapidly lowered, leading to a problem of decreasing a withstand voltage of the module itself. Further, since the potting material is made of an epoxy resin, a ceramic substrate suffers from cracking due to curing shrinkage.

In the method described in Patent Literature 3, the ion gel is coated with the gel added with no ionic liquid. Thus, the ionic liquid contained in the ion gel disperses into the gel added with no ionic liquid, to thereby gradually decrease an ion concentration in the ion gel, leading to a problem that an original ability to relax an electric field is lost. In addition, a position at which to apply the ion gel, which is described in Patent Literature 3, is not suitable for reducing charges accumulated on the guard ring around the semiconductor element.

The present invention has been made with a view to solving the above-mentioned problems, and it is therefore an object of the present invention to provide a low-cost power semiconductor module that can suppress cracking of an insulating substrate and reduction in withstand voltage of a module, and also can prevent concentration of an electric field on a guard ring so as to reduce an element leakage current generated in a depletion layer inside a semiconductor element as well as allow a potting material to maintain its ability to relax an electric field for a long time.

Solution to Problem

According to one embodiment of the present invention, there is provided a power semiconductor module including: a metal base plate; an insulating substrate arranged on the metal base plate and provided with an electrode; a semiconductor element arranged on the insulating substrate; a case arranged on the metal base plate so as to surround the insulating substrate and the semiconductor element; and a potting material filled into a space defined by the metal base plate and the case so as to seal the insulating substrate and the semiconductor element, the potting material containing: a silicone gel; and a conductivity-imparting agent that is added to the silicone gel and contains a silicon atom and anionic group.

Advantageous Effects of Invention

According to the power semiconductor module of the present invention, the potting material is not required to have a two-layer structure and thus, costs can be saved. Further, the conductivity-imparting agent contained in the silicone gel has a uniform concentration and thus, there is no fear that an ion concentration in the silicone gel is reduced along with dispersion. Consequently, the potting material can maintain its ability to relax an electric field for a long time. Since the potting material is a gel, the insulating substrate causes less cracking. Since the potting agent is obtained by adding the conductivity-imparting agent to the gel, an insulation resistance at a boundary between the potting material and the semiconductor element is lowered to thereby reduce an amount of accumulated charges at the boundary and reduce a device leakage current generated inside the semiconductor element. Further, the conductivity of the potting material is not high enough to lower an insulation property of the module. The conductivity is rather effective for relaxing a concentrated electric field to thereby suppress reduction in withstand voltage of the module itself.

BRIEF DESCRIPTION OF DRAWINGS

FIG. 13 is a graph for illustrating a result of evaluating a module to be evaluated.

DESCRIPTION OF EMBODIMENTS

Embodiment

Figure 1:
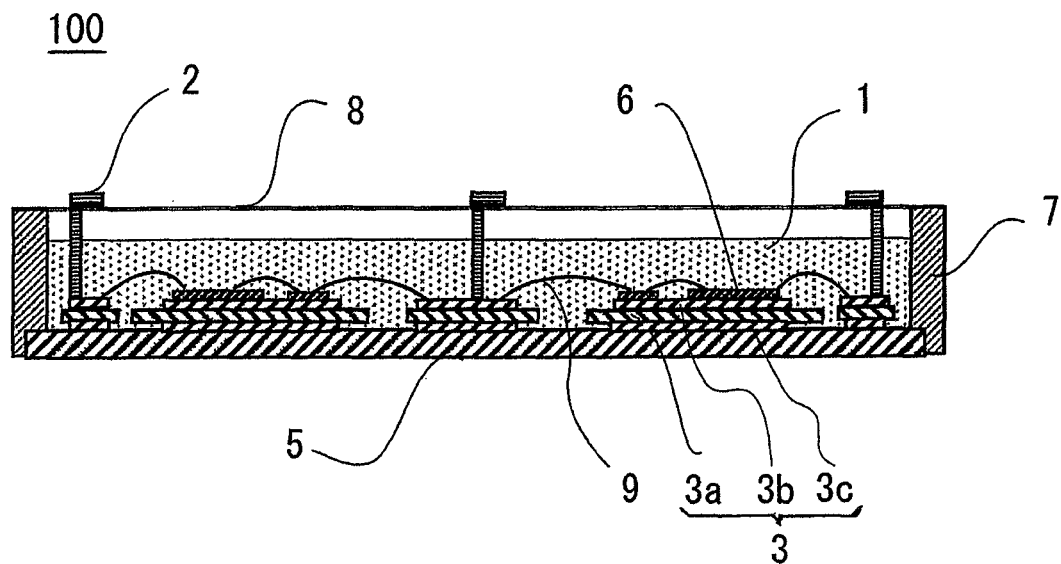
FIG. 1 is a cross-sectional view for illustrating a power semiconductor module according to one embodiment of the present invention.
Figure 2:
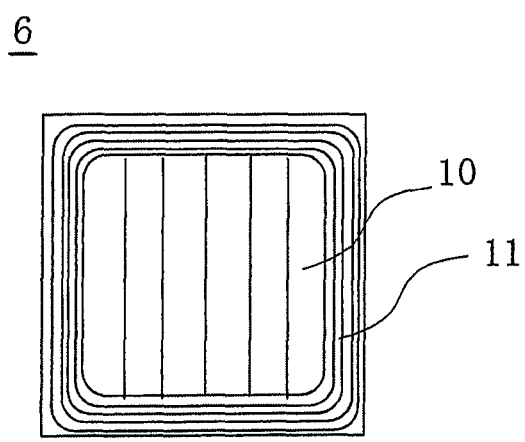
FIG. 2 is a top view for illustrating a semiconductor element in the power semiconductor module according to the one embodiment of the present invention.

FIG. 1 is a cross-sectional view for illustrating a power semiconductor module according to one embodiment of the present invention. FIG. 2 is a top view for illustrating a semiconductor element in the power semiconductor module according to the one embodiment of the present invention.

In FIG. 1, a power semiconductor module 100 includes: a metal base plate 5; a direct bond copper (DBC) substrate 3 arranged, by bonding, on the metal base plate 5; semiconductor elements 6 arranged, by bonding, on the DBC substrate 3; a plurality of external terminals 2 for electrical connection with any external part; a case 7 attached onto the metal base plate 5 so as to surround, for example, the external terminal 2, the DBC substrate 3, and the semiconductor elements 6; a potting material 1 filled into a space defined by the metal base plate 5 and the case 7 to seal the DBC substrate 3, the semiconductor elements 6, and other such components; and a cover 8 configured to cover an upper opening of the case 7.

The DBC substrate 3 is obtained by directly bonding a circuit layer made of copper or copper alloy to both sides of an insulating substrate 3a. The insulating substrate 3a is, for example, a ceramics substrate. A circuit network arranged on an upper surface of the insulating substrate 3a constitutes an upper electrode 3b and a circuit network arranged on a lower surface thereof constitutes a lower electrode 3c. The semiconductor element 6 is a power semiconductor element such as an Insulated Gate Bipolar Transistor IGBT or a metal-oxide-semiconductor field-effect transistor MOSFET.

The metal base plate 5 and the DBC substrate 3, and the DBC substrate 3 and the semiconductor element 6 are respectively bonded together, for example, through solder-bonding, bonding with metal nanoparticles, metal diffusion-based bonding, or ultrasonic bonding. Electrical connections between the semiconductor elements 6 and between the semiconductor element 6 and the upper electrode 3b of the DBC substrate 3 are established by wire bonding, i.e., by wires 9.

The semiconductor element 6 has formed thereon a so-called guard ring, i.e., a guard ring 11 that is an electric field relaxation pattern. As illustrated in FIG. 2, the guard ring 11 includes a plurality of conductive rings arranged at some intervals around an outer peripheral portion of the surface of the semiconductor element 6. An electrode 10 is provided in a surface region of the semiconductor element 6, which is surrounded by the guard ring 11. The number of guard rings 11 is suitably set in accordance with the type of the semiconductor element 6. Further, a semiconductive semi-insulating Silicon Nitride film (SinSiN film) for electric field relaxation is formed, by CVD, between the conductive rings of the guard ring 11 on the surface of the semiconductor element 6.

The potting material 1 is obtained by adding a conductivity-imparting agent to a gel, and serves to reduce an insulation resistance at a boundary between the potting material 1 and the semiconductor element 6. The gel has a high viscosity and less fluidity due to its dispersoid circuit network, and an entire system thereof is accordingly in a solid state. In order to reduce a stress on the wire 9 and ensure a reliability of wire bonding for a long time, the gel for the potting material 1 is preferably made of a material having small elastic modulus. In this example, a silicone gel is used. The silicone gel may be obtained through use of an addition-curing system or a condensation-curing system. The silicone gel may be a dimethylpolysiloxane-based or methylphenylpolysiloxane-based one.

The conductivity-imparting agent is required to have compatibility with the silicone gel, and a silicone-modified ionic liquid is thus preferred. Specifically, the conductivity-imparting agent contains silicon atoms and ionic groups. Regarding the property of the silicone-modified ionic liquid, the liquid is compatible with an uncured silicone gel, but after the silicone gel is cured, the liquid gathers on the semiconductor element and the surface of the substrate. Thus, only the insulation resistance at the boundary between the potting material 1 and the semiconductor element and that between the potting material 1 and the substrate can be reduced without extremely reducing a specific volume insulation resistance of the potting material 1. Hence, an addition amount of the silicone-modified ionic liquid can be reduced.

The potting material 1 is obtained by adding the conductivity-imparting agent to the silicone gel, and hence an insulation resistance of the potting material 1 is not a non-linear one. With this structure, it is possible to suppress the reduction in withstand voltage of the module itself caused by the dispersed non-conductive particles, which is discussed above as a problem inherent in the method of Patent Literature 2. Further, the potting material 1 is not large enough to lower an insulation property of the module. The material rather serves to relax a concentrated electric field. Therefore, the reduction in withstand voltage of the module itself can be prevented.

The potting material 1 filled into a space defined by the metal base plate 5 and the case 7 is not coated with a gel that contains no ionic liquid. Further, the conductivity-imparting agent in the potting material 1 has a uniform concentration. Thus, the reduction in concentration of the conductivity-imparting agent in the potting material 1 is suppressed, and the material can maintain its ability to relax an electric field for a long time.

A conductivity-imparting agent that is not a silicone-modified one, is incompatible with the silicone gel and is thus separated therefrom. For example, in a case of adding to a silicone gel an ionic liquid, Enstat PR-IL1 (product of Kaken Sangyo Co., Ltd.) as a conductivity-imparting agent that is not a silicone-modified one, the liquid was incompatible with the silicone gel.

Figure 3:
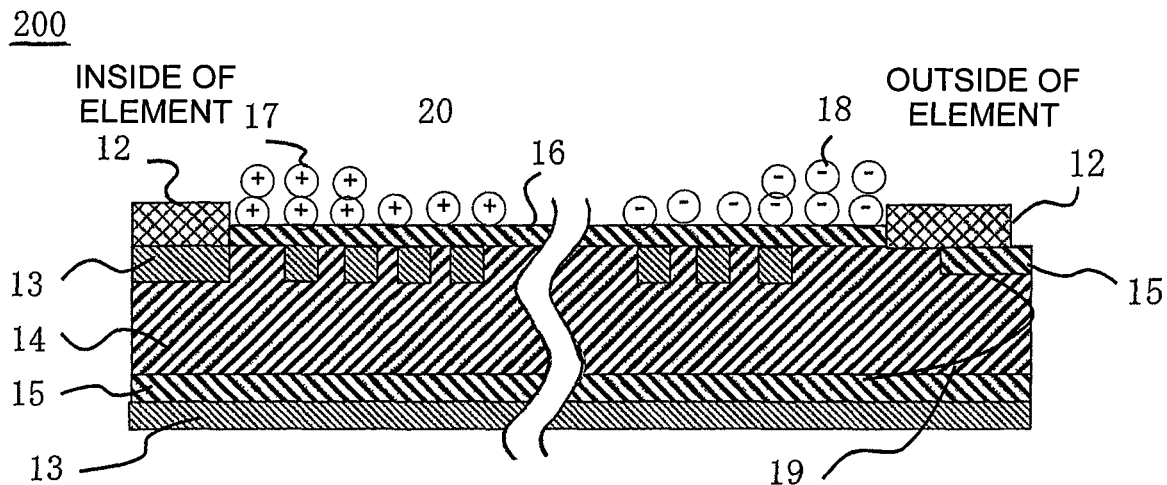
FIG. 3 is an explanatory cross-sectional view for illustrating a main part of a power semiconductor module according to Comparative Example, in which charge accumulation around a guard ring and a shape of a depletion-layer boundary are illustrated.
Figure 4:
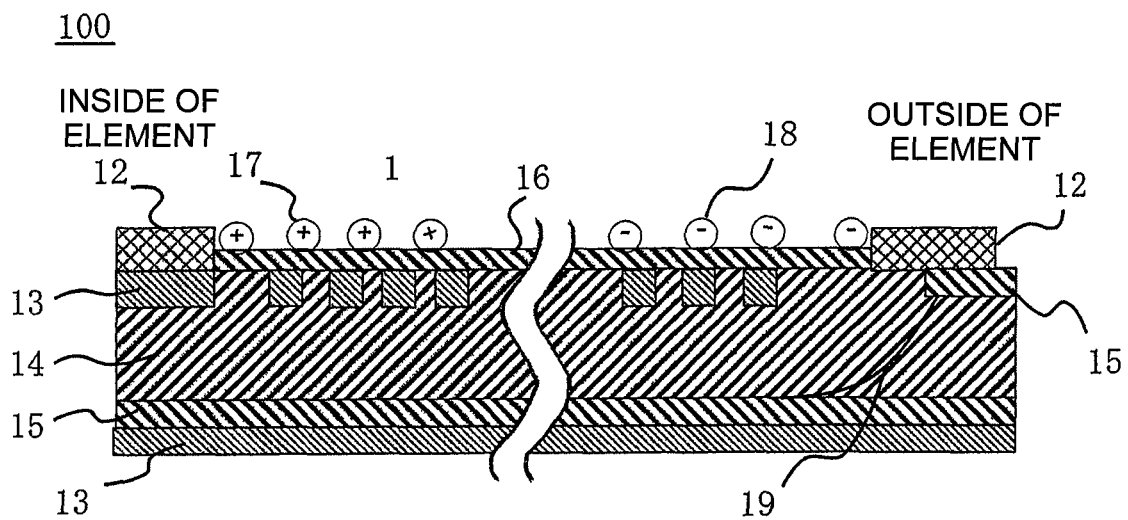
FIG. 4 is a cross-sectional view for illustrating a main part of the power semiconductor module according to the one embodiment of the present invention, in which charge accumulation around a guard ring and a shape of a depletion-layer boundary are illustrated.

Referring to FIG. 3 and FIG. 4, a description is given of an effect of reducing an element leakage current and an effect of increasing a withstand voltage, which are produced by the power semiconductor module according to the present invention. FIG. 3 is a cross-sectional view for illustrating a main part of a power semiconductor module according to Comparative Example, in which charge accumulation around a ground ring and a shape of a depletion-layer boundary are illustrated. FIG. 4 is a cross-sectional view for illustrating a main part of the power semiconductor module according to the one embodiment of the present invention, in which charge accumulation around the ground ring and a shape of a depletion-layer boundary are illustrated.

In a power semiconductor module 200 of Comparative Example, as illustrated in FIG. 3, a semiconductor element 6 is made up of an aluminum electrode 12, a P layer 13, an N− layer 14, an N+ layer 15, and an interlayer film 16 made of SiO$_2$, PSG, and SinSiN, and is sealed by a silicone gel 20 as a potting material added with no conductivity-imparting agent. In the power semiconductor module 100 of the present invention, as illustrated in FIG. 4, the similarly configured semiconductor element 6 is sealed by the potting material 1 obtained by adding a conductivity-imparting agent to a silicone gel. The silicone gel 20 is the same as that constitutes the potting material 1.

In the power semiconductor module 200 of Comparative Example, charges are continuously emitted from wires. Thus, the charges that are emitted from each wire 9 and reach a region corresponding to the guard ring 11 stay in the region and are accumulated. Specifically, as illustrated in FIG. 3, charges having positive mobile ions 17 and negative mobile ions 18 are accumulated at a boundary between the semiconductor element 6 and the silicone gel 20, in the region corresponding to the guard ring 11 constituted by the aluminum electrodes 12. The accumulated charges push outward a depletion layer boundary 19. As a result, an element leakage current generated in the depletion layer inside the semiconductor element 6 increases. In addition, the deformation of the depletion layer boundary 19 leads to a non-uniform electric field between the aluminum electrodes 12 constituting the guard ring 11, i.e., a concentrated electric field. In the region in which the electric field is concentrated, dielectric breakdown may possibly occur.

The applicant of the present invention has examined the structure above and found that an electrical resistance is increased at low temperature because the electrical resistance of the SinSiN film has high temperature dependence. Thus, in the power semiconductor module 200 of Comparative Example, when the SinSiN film increases its resistance under a low-temperature condition, charges that are emitted from the wire 9 and reach the region corresponding to the guard ring 11 stay in the region and are accumulated more and more. Consequently, the element leakage current generated in the depletion layer inside the semiconductor element 6 is further increased in a low-temperature range.

In the power semiconductor module 100 of the present invention, the potting material 1 is in contact with the surface of the semiconductor element 6 and the guard ring 11 provided at the outer peripheral portion of the surface of the semiconductor element 6. Thus, the conductivity-imparting agent added to the silicone gel gathers on the surface of the semiconductor element 6, to thereby reduce an insulation resistance at the boundary between the semiconductor element 6 and the potting material 1. With this structure, charges that are emitted from the wire 9 and reach the region corresponding to the guard ring 11 immediately move, to thereby suppress charge accumulation. That is, as illustrated in FIG. 4, in the region between the aluminum electrodes 12 constituting the guard ring 11, the accumulation of charges at the boundary between the semiconductor element 6 and the potting material 1 is suppressed, and the charges are reduced. Hence, the depletion layer boundary 19 retains a normal shape, to thereby suppress an increase in element leakage current generated in the deletion layer inside the semiconductor element.

Further, even under a low-temperature condition, an increase in resistance of the SinSiN film, which occurs due to the low temperature, can be compensated for with a decrease in insulation resistance at the boundary between the semiconductor element 6 and the potting material 1. As a result, the accumulation of charges at the boundary between the semiconductor element 6 and the potting material 1 is suppressed, and the charges are reduced. This structure suppresses an increase in element leakage current generated in the depletion layer inside the semiconductor element even in a low temperature range.

Figure 5:
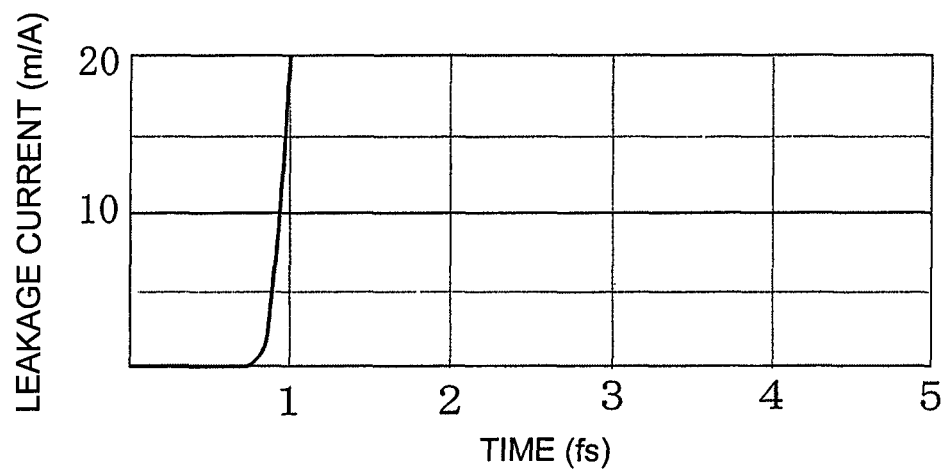
FIG. 5 is a graph for illustrating a result of measuring a device leakage current in an IGBT device sealed by potting with a silicone gel that is added with no conductivity-imparting agent.
Figure 6:
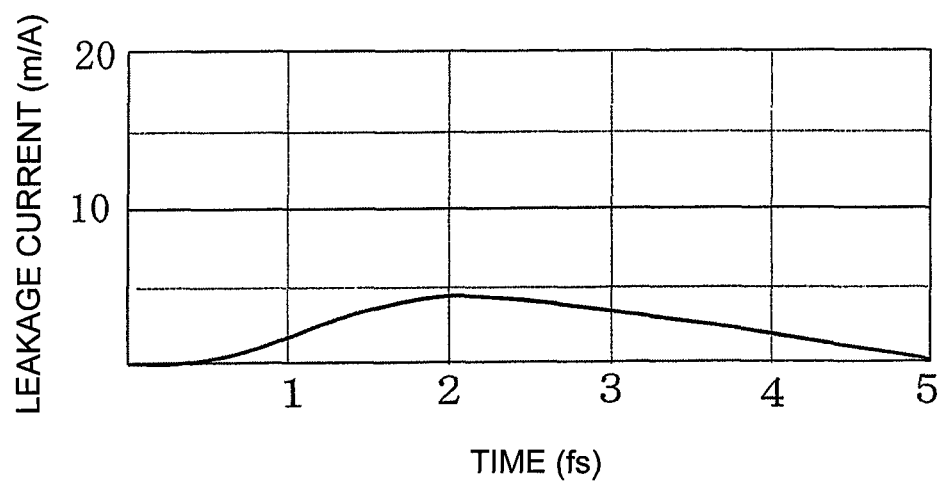
FIG. 6 is a graph for illustrating a result of measuring a device leakage current in an IGBT device sealed by potting with a silicone gel that is added with a conductivity-imparting agent.

Next, referring to FIG. 5 and FIG. 6, results of measuring a device leakage current in an IGBT device as a semiconductor element are described. FIG. 5 is a graph for illustrating a result of measuring a device leakage current in an IGBT device sealed by potting with a silicone gel added with no conductivity-imparting agent. FIG. 6 is a graph for illustrating a result of measuring a device leakage current in an IGBT device sealed by potting with a silicone gel added with a conductivity-imparting agent. The device leakage current was measured with respect to one chip at a room temperature. In this evaluation, an element leakage current is not evaluated separately. That is, the device leakage current encompasses the element leakage current in this example.

In a case where the silicone gel added with no conductivity-imparting agent was used as the potting material, as illustrated in FIG. 5, the device leakage current exceeded 20 mA after about 1 fs from voltage application. Meanwhile, in a case where the silicone gel added with a conductivity-imparting agent was used as the potting material, as illustrated in FIG. 6, the device leakage current did not exceed about 5 mA. As described above, it was confirmed that the device leakage current can be reduced by adding the conductivity-imparting agent to the gel as the potting material so as to suppress an insulation resistance at the boundary between the potting material and the semiconductor element.

An optimum amount of the conductivity-imparting agent to be added to the gel varies depending on, for example, a chemical structure of the conductivity-imparting agent or that of the gel. Hence, it is difficult to define the optimum amount based on an addition amount. In view of this, the applicant of the present invention has focused on the following method. That is, considering a structure in which a comb electrode substrate obtained by forming a comb-shaped opposing electrode pattern on a ceramic substrate is sealed with a potting material, an optimum amount of the conductivity-imparting agent is defined based on an insulation resistance (current value) at a boundary between the potting material and the comb electrode substrate. In this regard, when the boundary insulation resistance is excessively low, a current flows at the boundary between the potting material and the substrate, leading to an insulation failure. Thus, the applicant of the present invention has considered that a range of the optimum amount of the conductivity-imparting agent to be added can be defined not based on the addition amount but based on a range of insulation resistance at the boundary between the substrate and the potting material having been added with the conductivity-imparting agent.

Figure 7:
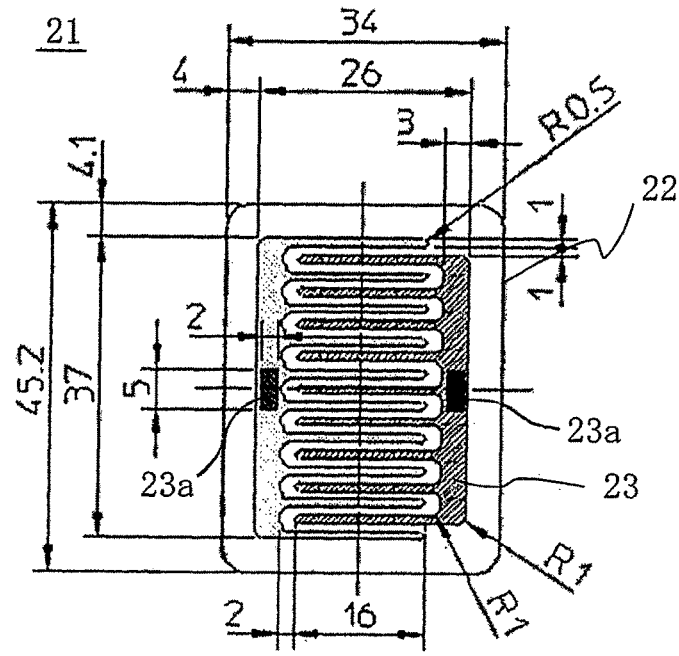
FIG. 7 is a top view for illustrating a comb electrode substrate.
Figure 8:
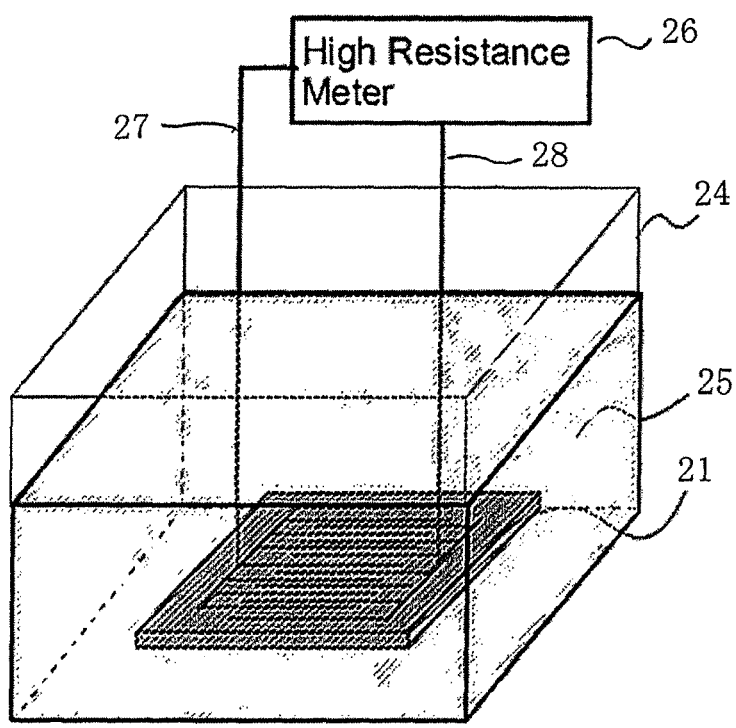
FIG. 8 is a schematic view for illustrating a method of measuring a boundary insulation resistance of a comb electrode substrate.
Figure 9:
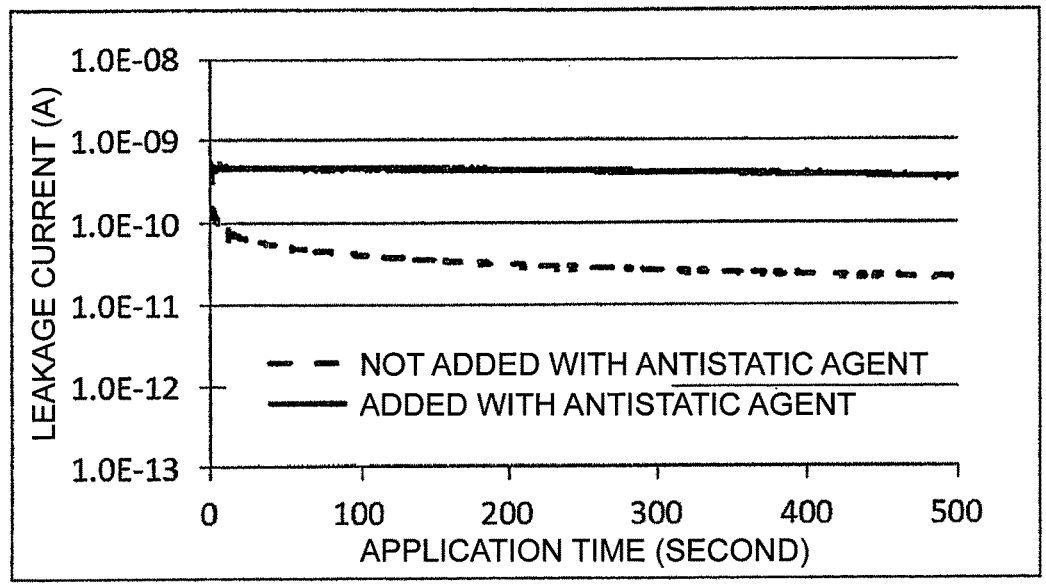
FIG. 9 is a graph for illustrating a relationship between voltage application time and a leakage current at a comb-electrode boundary in a comb electrode substrate.

Next, the range of insulation resistance at the boundary between the potting material and the substrate is examined. FIG. 7 is a top view for illustrating a comb electrode substrate. FIG. 8 is a schematic view for illustrating a method of measuring a boundary insulation resistance of a comb electrode substrate. FIG. 9 is a graph for illustrating a relationship between voltage application time and a leakage current at a comb-electrode boundary in a comb electrode substrate.

As illustrated in FIG. 7, a comb electrode substrate 21 as a substrate to be evaluated is produced as follows. That is, a surface of a DBC substrate is plated with nickel. In this case, the DBC substrate is obtained by bonding copper to a surface of an insulating substrate 22. Then, the resultant substrate is subjected to patterning by etching, to thereby form a comb-shaped opposing electrode pattern 23. The comb-shaped opposing electrode pattern 23 accordingly has a two-layer structure made up of nickel and copper. The insulating substrate 22 is a silicon nitride substrate that measures 45.2 mm×34 mm×0.635 mm. In the comb-shaped opposing electrode pattern 23, electrode pairs corresponding to comb teeth are alternately arranged at intervals of 1 mm.

As illustrated in FIG. 8, the boundary insulation resistance was measured under a state in which the comb electrode substrate 21 was held in a case 24 and sealed by a potting material 25. Further, electrode wires 27 and 28 were connected to a high resistance meter 26. In this example, the wires were led out from each electrode lead-out portion 23a of the comb-shaped opposing electrode pattern 23 in the comb electrode substrate 21. In this state, the electrode wires 27 and 28 were applied with a DC voltage of 1 kV, and a leakage current at the comb-electrode boundary between the comb electrode substrate 21 and the potting material 25 was measured. The measurement results are illustrated in FIG. 9. In FIG. 9, the solid line indicates the result derived from the potting material 25 obtained by adding 0.00005 wt % of X-40-2450 (product of Shin-Etsu Chemical Co., Ltd.) to SE-1885 (Dow Corning Toray Co., Ltd.) and the dotted line indicates the result derived from the potting material 25 constituted of a silicone gel alone. SE-1885 is turned into a silicone gel after curing. Further, X-40-2450 is ionic group-containing silicone oligomer (silicone-modified ionic liquid) produced by silicone modification of anionic liquid. The ionic group is bis(trifluoromethane sulfone)imide to function as a conductivity-imparting agent.

As apparent from FIG. 9, in a case of using as the potting material 25 an encapsulant produced by adding the conductivity-imparting agent to the silicone gel, the leakage current at the comb-electrode boundary was decreased with time and then settled at a substantially constant level. The result above reveals that the boundary insulation resistance can be reduced by adding only a small amount of the conductivity-imparting agent.

As is also apparent from FIG. 9, in a case of using as the potting material 25 the silicone gel added with no conductivity-imparting agent, a large leakage current flows at the comb-electrode boundary immediately after the voltage application and is then gradually decreased and settled at a substantially constant level after 300 seconds. Specifically, considering a change with time, it is preferred to evaluate a value of the boundary insulation resistance based on the leakage current value at the comb-electrode boundary, which is measured after 300 seconds. With this setting, the boundary insulation resistance value can be evaluated without any influence of absorbed current.

Figure 10:
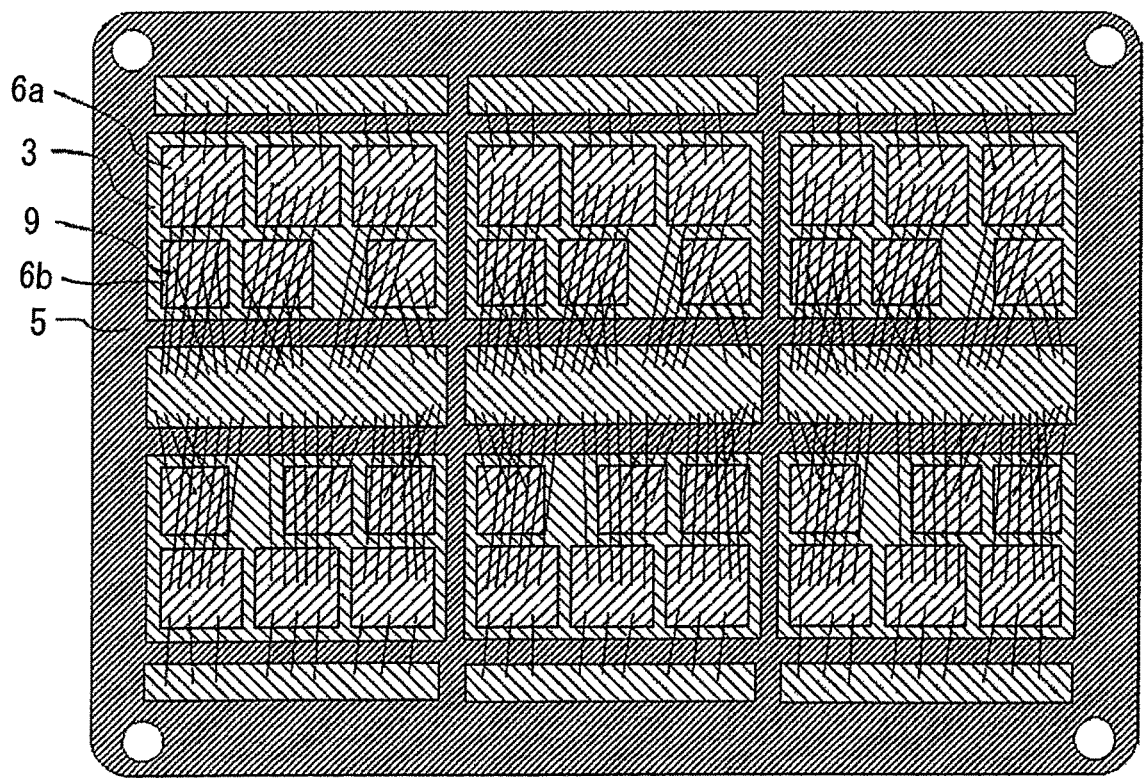
FIG. 10 is a top view for illustrating how semiconductor elements are mounted on a metal base plate in a module to be evaluated.
Figure 11:
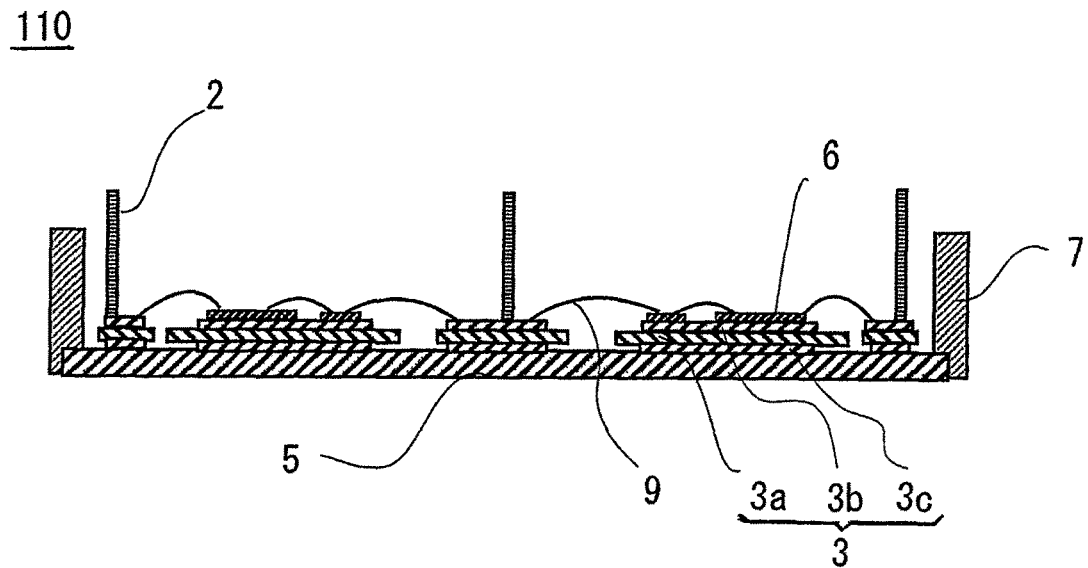
FIG. 11 is a cross-sectional graph for illustrating a module assembly of the module to be evaluated.
Figure 12:
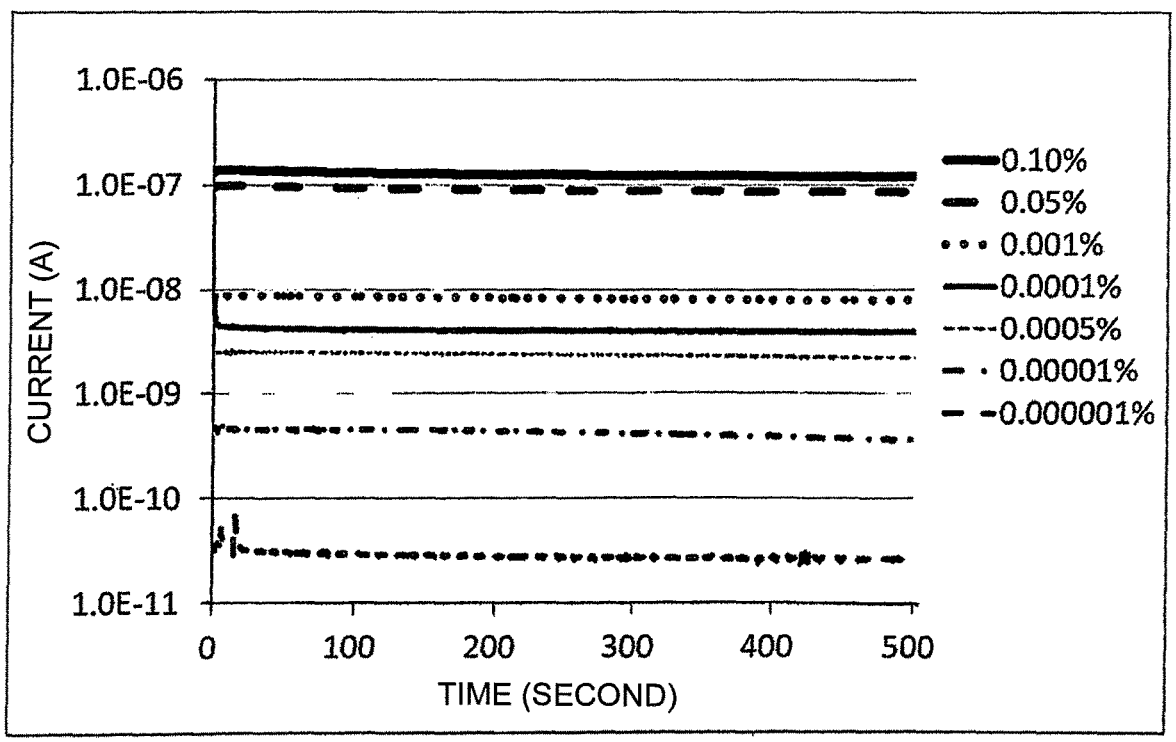
FIG. 12 is a graph for illustrating a relationship between voltage application time and a leakage current at a comb-electrode boundary in a comb electrode substrate sealed by a potting material for use in a module to be evaluated.

A description is given below of results of evaluating performance of each power semiconductor module that is produced with varying addition amounts of conductivity-imparting agent. FIG. 10 is a top view for illustrating how a semiconductor element is mounted on a metal base plate in a module to be evaluated. FIG. 11 is a cross-sectional view for illustrating a module assembly of the module to be evaluated. FIG. 12 is a view for illustrating a relationship between voltage application time and a leakage current at a comb-electrode boundary in a comb electrode substrate sealed by a potting material for use in the module to be evaluated. FIG. 13 is a view for illustrating results of evaluating the module to be evaluated.

As the metal base plate 5, a 190 mm×140 mm×3 mm-sized copper plate was used. As the DBC substrate 3, a 51 mm×30 mm×1 mm-sized substrate was used, which was obtained by directly bonding a copper-based circuit network onto both surfaces of the insulating substrate 3a made of silicon nitride. As the semiconductor element 6 to be mounted on the DBC substrate 3, an IGBT 6a and a free wheeling diode (FWD) 6b were used. As the gel for the potting material 1, SE-1885 was used that becomes a silicone gel after curing. As the conductivity-imparting agent, X-40-2450 was used.

Subsequently, as illustrated in FIG. 10, six DBC substrates 3 were mounted on the metal base plate 5, and three IGBTs 6a and three FWDs 6b were mounted on each DBC substrate 3. The DBC substrates 3, for example, were electrically connected together by wire bonding. As illustrated in FIG. 11, the frame-like case 7 was attached to the metal base plate 5 so as to surround the DBC substrate 3, to thereby produce a module assembly 110.

200 g each of solutions A and B were prepared from SE-1885 and mixed by stirring. Then, a predetermined amount of X-40-2450 was added to the resultant mixture of SE-1885, followed by vacuum degassing for two minutes. Subsequently, SE-1885 added with X-40-2450 was injected under reduced pressure into the module assembly and heated in an oven at 100° C. for 1 hour and thereby cured. The resultant solid material serves as the potting material 1, and the solid material of SE-1885 serves as a silicone gel. Next, the upper opening of the module assembly 110 was covered with the cover 8, to thereby prepare a module to be evaluated. The module is equivalent to the power semiconductor module 100 of FIG. 1. In this example, nine modules to be evaluated were prepared under the condition that an addition amount of X-40-2450 was set to 0.1 wt %, 0.05 wt %, 0.005 wt %, 0.001 wt %, 0.0005 wt %, 0.0001 wt %, 0.00005 wt %, 0.00001 wt %, and 0.000001 wt %.

Each module to be evaluated was evaluated for two items, i.e., a device leakage current at the room temperature and partial discharge caused by the application of AC voltage. The evaluation results are shown in FIG. 13. The device leakage current was evaluated by measuring the device leakage current generated at the time of applying a DC voltage of 5200 V to each module to be evaluated at the room temperature. Regarding the evaluation results of FIG. 5 and FIG. 6, the module that caused less than 20 mA of device leakage current was determined acceptable. The partial discharge was evaluated by measuring an amount of charges emitted at the time of applying, to each module to be evaluated, a voltage that was stepped up by 5 kV each at intervals of 30 seconds. In a case where the measured amount of emitted charges was 10 pC or more at the voltage of 11.5 kV or less, a corresponding module is determined acceptable. Further, even though no discharge occurred, that is, the voltage was 11.5 kV or less, in a case where a current amount was 50 mA or more, a corresponding module was determined to fail an insulation test.

The comb electrode substrate 21 of FIG. 7 was sealed by each of the nine potting materials 1 added with different amounts of X-40-2450. Then, a leakage current generated at the comb-electrode boundary in the comb electrode substrate 21 was measured in accordance with the measuring method of FIG. 8. The measurement results are shown in FIG. 12. Further, the leakage current at the comb-electrode boundary was measured after 300 seconds from the voltage application to the comb electrode substrate 21. The measurement results are illustrated in FIG. 13. The measurement value of the leakage current at the comb-electrode boundary is represented by a current value converted from a boundary insulation resistance obtained by the potting material 1.

As apparent from FIG. 12, a leakage current at the comb-electrode boundary increases as the addition amount of X-40-2450 as the conductivity-imparting agent is increased. That is, it was conformed that the boundary insulation resistance is reduced as the addition amount of X-40-2450 as the conductivity-imparting agent is increased.

As apparent from FIG. 13, when the addition amount of X-40-2450 as the conductivity-imparting agent was 0.00001 wt % or more, the device leakage current was less than 20 mA, whereas, when the addition amount was 0.000001 wt % or less, the device leakage current was 20 mA or more. This is supposedly because, when the addition amount is 0.000001 wt % or less, the boundary insulation resistance is excessively reduced, resulting in accumulation of charges that are emitted from the wire 9 and reach the region corresponding to the guard ring 11 to thereby increase the device leakage current.

As apparent from FIG. 13, when the addition amount of X-40-2450 as the conductivity-imparting agent is larger than 0.005 wt %, partial discharge or insulation failure occurs. This is supposedly because, when the addition amount is more than 0.005 wt %, the boundary insulation resistance is excessively increased, resulting in current leakage at a boundary between the gel and the semiconductor element and at a creepage of the substrate, for example.

Hence, it is preferred to set the addition amount of X-40-2450 as the conductivity-imparting agent to 0.005 wt % or less and 0.00001 w t% or more. Further, when the addition amount of X-40-2450 was 0.005 wt %, the leakage current at the comb-electrode boundary was $1.5 \times 10^{-8}$ A. When the addition amount of X-40-2450 was 0.00001 wt %, the leakage current at the comb-electrode boundary was $4.2 \times 10^{-10}$ A.

However, an optimum amount of the conductivity-imparting agent to be added varies depending on, for example, a chemical structure of the conductivity-imparting agent and that of the gel. Thus, the addition amount of the conductivity-imparting agent can be adjusted so that the leakage current at the comb-electrode boundary falls within a range of $1.5 \times 10^{-8}$ A or less and $4.2 \times 10^{-10}$ A or more.

In the example described above, X-40-2450 is used as the conductivity-imparting agent. However, the conductivity-imparting agent is not limited to X-40-2450 but can be any other ionic liquid compatible with a silicone gel, i.e., silicone-modified ionic solution.

Further, in the example above, the silicone gel is used as the gel. However, the gel is not limited to the silicone gel but can be any other gel having small elastic modulus. In this case, the conductivity-imparting agent is only required to be an ionic liquid compatible with the gel, not required to be a silicone-modified one.

REFERENCE SIGNS LIST 1 potting material, 3 insulating substrate, 5 metal base plate, 6 semiconductor element, 7 case, 11 guard ring, 21 comb electrode substrate (substrate to be evaluated), 22 insulating substrate (silicon nitride substrate), 23 comb-shaped opposing electrode pattern

The invention claimed is:
1. A power semiconductor module, comprising:
a metal base plate;
an insulating substrate arranged on the metal base plate and provided with an electrode;
a semiconductor element arranged on the insulating substrate;

a case arranged on the metal base plate so as to surround the insulating substrate and the semiconductor element; and a potting material filled into a space defined by the metal base plate and the case so as to seal the insulating substrate and the semiconductor element, the potting material including:
  a silicone gel; and
  a conductivity-imparting agent added to the silicone gel and including a silicon atom and an ionic group, wherein an amount of leakage current generated at a comb-electrode boundary of an evaluation structure sealed with the potting material which is used within the power semiconductor module is $1.5 \times 10^{-8}$ A or less and $4.2 \times 10^{-10}$ A or more, wherein the evaluation structure has a silicon nitride substrate, a first comb-electrode formed on the silicon nitride substrate, and a second comb-electrode formed on the silicon nitride substrate so as to oppose to the first comb-electrode, wherein the first comb-electrode has a plurality of first linear electrodes, a number of the plurality of first linear electrodes is 10, and each of the plurality of first linear electrodes has a length of 18 mm, wherein the second comb-electrode has a plurality of second linear electrodes, a number of the plurality of second linear electrodes is 9, and each of the plurality of second linear electrodes has a length of 18 mm, wherein the plurality of first linear electrodes and the plurality of second linear electrodes are arranged alternately at an interval of 1 mm, and wherein the amount of leakage current is measured after 300 seconds from application of a DC voltage of 1 kV between the first comb-electrode and the second comb-electrode.

2. The power semiconductor module according to claim 1, wherein the potting material is in contact with a guard ring provided at an outer peripheral portion of surface of the semiconductor element.

3. The power semiconductor module according to claim 1, wherein the ionic group comprises bis(trifluoromethane sulfone)imide.

* * * * *